United States Patent [19]

Devaney et al.

[11] Patent Number: 4,634,493

[45] Date of Patent: Jan. 6, 1987

[54] METHOD FOR MAKING SEMICONDUCTOR CRYSTALS

[75] Inventors: Christopher M. Devaney, Sutton; Robert J. Martineau, Marlboro; John L. Miles, Belmont, all of Mass.; Theodore T. S. Wong, Montgommeryville, Pa.

[73] Assignee: The United States of America as represented by the Secretary of the Air Force, Washington, D.C.

[21] Appl. No.: 544,553

[22] Filed: Oct. 24, 1983

[51] Int. Cl.[4] .............................................. C30B 21/02
[52] U.S. Cl. ................................. 156/616 R; 156/624; 156/DIG. 72; 156/DIG. 82; 252/62.3 ZT; 252/62.3 V
[58] Field of Search .................... 156/603, 622, 623 R, 156/624, DIG. 72, DIG. 82, 616 R; 23/305 R; 164/71.1, 122.1, 122.2; 252/62.3 ZT, 62.3 V, 62.3 S; 420/526, 903

[56] References Cited

U.S. PATENT DOCUMENTS

| | | | |
|---|---|---|---|
| 3,362,795 | 1/1968 | Weisbeck | 23/305 R |
| 3,468,363 | 9/1969 | Parker et al. | 420/526 |
| 3,494,730 | 2/1970 | Tai et al. | 156/624 |
| 3,549,401 | 12/1970 | Buszko et al. | 156/622 |
| 4,030,964 | 6/1977 | Schieber et al. | 23/305 R |
| 4,344,476 | 8/1982 | Sutcliffe et al. | 156/624 |

OTHER PUBLICATIONS

Kruse (1965) Applied Optics, 4(6):687.
Bartlett et al., (1969), J. Material Sci., 4:266.
Hardened Intrinsic Detector Development, (5/81), Army Materials and Mechanics Research Center, Contract DAAG 46-80-C-0046, Final Report TR81-23.
Planar Solid State Recrystallization Development, (5/81), Air Force Wright Aeronautical Lab., Contract F33615-79-C-5058, Final Report, Report No. TR-8-1-4029.

*Primary Examiner*—David L. Lacey
*Attorney, Agent, or Firm*—Fredric L. Sinder; Donald J. Singer

[57] ABSTRACT

A planar solid-state recrystallization process for growing mercury cadmium telluride (MCT) crystals suitable for semiconductor applications, in which molten MCT material is solidified in a horizontal sealed ampoule having a substantial portion of its lower external surface (i.e. a part of the ampoule surface which contains molten material) in heat-transfer contact with a heat sink, and having no substantial portion of the vapor-containing segment of the external ampoule wall in contact with that heat sink.

14 Claims, 10 Drawing Figures

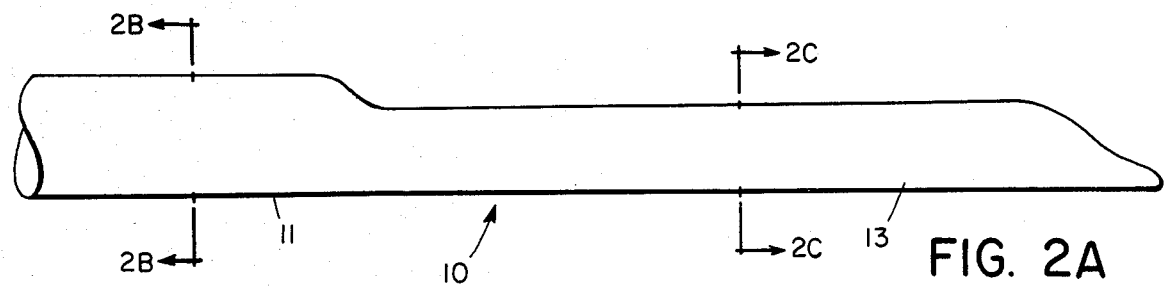
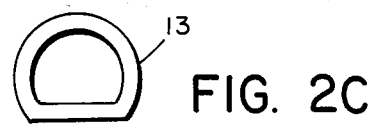
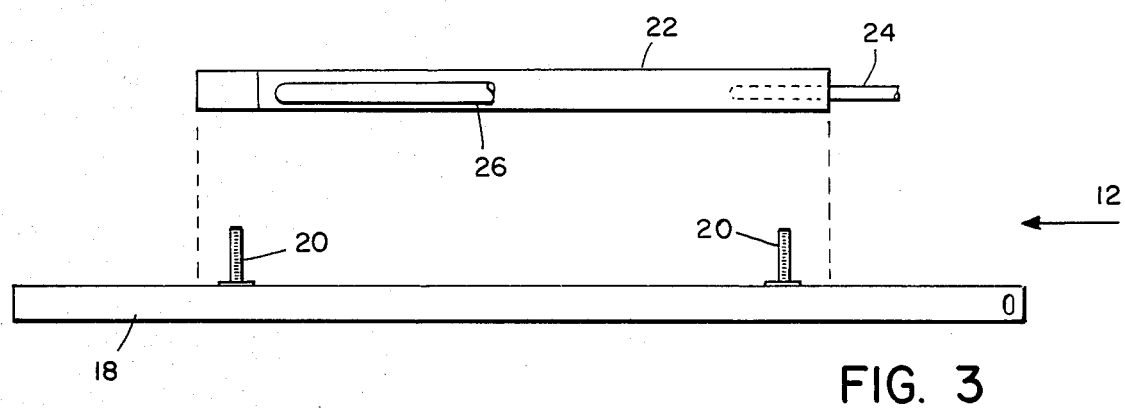
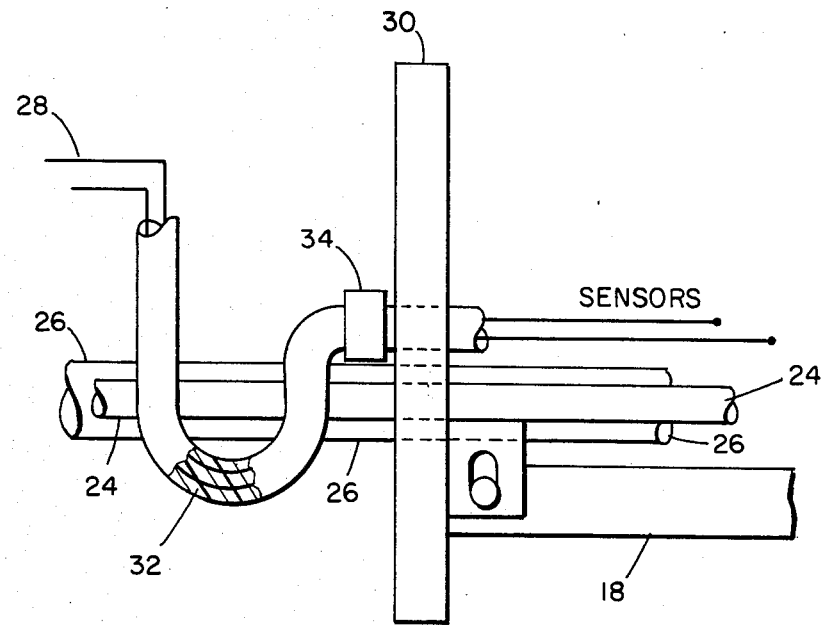

METHOD FOR MAKING SEMICONDUCTOR CRYSTALS

The U.S. Government has rights in this invention pursuant to Contract No. F33615-79-C-5058 awarded by the Department of the Air Force.

BACKGROUND OF THE INVENTION

This invention relates to solid-state recrystallization (SSR) methods of growing mercury cadmium telluride (MCT) crystals suitable for semiconductor applications.

Mercury cadmmum telluride (MCT or HgCdTe) is a so-called pseudo-binary semiconducting material, meaning that it is a mixture of mercury telluride and cadmium telluride which behaves as if it were composed entirely of a single metal-telluride compound. MCT is frequently used as a photo-sensing material, and the photo-energy it absorbs is very sensitive to its stoichiometry—i.e. the ratio of mercury telluride to cadmium telluride. Accordingly, it is critical when growing MCT crystals to be able to control stoichiometry.

MCT crystal growth is particularly difficult because the melting points of mercury telluride and cadmium telluride are relatively widely separated, and slow cooling of a molten mixture of the two compounds results in their segregation, with the higher melting compound solidifying first. Thus, traditional techniques which involve crystal growth by slowly cooling a melt yield crystals with unsatisfactory compositional variation. The relatively high vapor pressure of one of the components (mercury) also contributes to the difficulty experienced in controlling MCT composition, because the mercury tends to vaporize to a greater extent and at a faster rate than the other two components.

An example of a melt-growth method for making MCT ingots involves the use of a Bridgman furnace as disclosed in P. W. Kruse, Appl. Optics, Vol 4, No. 6, p. 687, 1965, and B. E. Bartlett, et. al., J. Materials Science, Vol 4, p. 266, 1969. The slow solidification in the Bridgman furnace results in a compositional gradient from one end of the ingot to the other due to segregation of the components. A relatively faster Bridgman soldification process reduces the compositional variation in the axial direction (i.e., along the axis of the cylindical ingot), but only at the expense of worsening the compositional variation in the radial direction.

To avoid the above problems, a melt of known composition may be quenched at a rate that is too fast to produce satisfactory crystallinity; crystal structure of the resulting solid may be improved by heating it to a high temperature that is still below the melting point. The high temperature provides sufficient energy to support crystal growth within small distances, which significantly improves the crystal structure. The principle of this technique, called solid phase growth or solid state recrystallization (SSR), is that rapid solidification locks in macroscopic compositional homogeneity and subsequent annealing at a temperature just below the solidus improves both microscopic compositional homogenization via solid state diffusion and grain growth via solid state recrystallization. The objective of solid phase growth is to eliminate the problem inherent in all melt-growth methods, namely, segregation due to remelt.

With these fast cooling techniques, excessive cooling rates can damage the material due to rapid radial contraction of material upon solidification which produces pitting, piping, blow holes, and cavities, or mercury vapor eruption due to cooling of the vapor space over the material. Slowing the cooling rate, however, results in detrimental loss of compositional uniformity from coring. Reducing the diameter of the ampoule ameliorates these problems to some extent but reduces the chances of obtaining single crystals large enough to fabricate the multi-element arrays now required for many applications.

Several variations of the quenching method of solid phase growth have been suggested. The ampoule may be removed from the rocking furnace, in which the raw materials have been melted and rocked for mixing, and immediately dropped into a water or ice bath. Alternately, the ampoule may be contained in a pipe in the rocking furnace and a cold gas stream directed through the pipe to quench the melt. These two methods are discussed in U.S. Pat. No. 3,468,363. In U.S. Pat. No. 3,468,363 the portion of the ampoule containing the liquid is removed from the furnace and immersed in an oil bath while the portion of the ampoule containing the vapor space is positioned inside the furnace so that the vapor space is kept hot while the liquid is being frozen.

For some years, New England Research Center and others have used a solid state recrystallization technique in which a sealed ampoule containing the three elemental materials is mounted in a pressure vessel within the rocking furnace. After the materials have been mixed and reacted, they are rapidly soldified by gas flow from an inlet at one end of the pressure vessel, along the cylindrical wall of the ampoule, and through an outlet at the other end of the pressure vessel. During at least the initial stages of this quench flow, positive pressure is maintained within the vessel at a level sufficiently high to curtail explosions. Experience at NERC has shown that the uniformity and other characteristics of crystals produced using the system are erratic.

SUMMARY OF THE INVENTION

The invention features an SSR process called "Planar Quench" in which molten MCT material is solidified in a horizontal sealed ampoule having a substantial portion of its lower external surface (i.e. a part of the ampoule surface which contains molten material) in heat-transfer contact with a heat sink, and having no substantial portion of the vapor-containing segment of the external ampoule wall in contact with that heat sink.

Preferably, the ampoule and heat sink are insulated from ambient furnace conditions; the rate of cooling from the melt is over 550 degrees centigrade/minute; the heat sink contacts a flat-bottom portion of the ampoule; cooling is effected in part by passing cooling gas through the cooling block, by means other than the means used to maintain buttressing pressure around the ampoule; and the ampoule is maintained horizontal during quench by a levelling means.

The Planar Quench method provides for unidirectional heat flow perpendicular to the ampoule axis. Because the bottom of the ampoule is in contact with the heat sink, heat is removed from the bottom of the crystal while the vapor space is maintained at a higher temperature to avoid mercury vapor eruption. The quench rate in this configuration can be increased an order of magnitude over that of conventional techniques, yet damage is minimized because vapor/liquid balance is maintained and radial contraction of material is avoided. The rapid unidirectional quench results in a tightly spaced, uniform dendritic microstructure in the as-quenched plank. This microstructure is responsible for the increase in compositional uniformity of the plank after solid state recrystallization.

This method offers controllability in that the final alloy composition is the same as that of the originally formulated melt. Furthermore, the method offers larger throughput capability because it results in a larger ingot yield, namely, a larger portion of the ingot possesses a uniform alloy composition and there is less opportunity for piping or pitting in the core of the ingot.

DESCRIPTION OF THE PREFERRED EMBODIMENT

We turn first to a brief description of the drawings of a preferred embodiment of the invention.

DRAWINGS

FIGS. 2A–2C are cross sections of the ampoule used for PSSR.

FIG. 3 is an exploded side view of the cooling block apparatus.

FIG. 4 is a side view of the mating flange assembly with parts in section.

METHOD

Briefly stated, the method of Planar Quench consists of mixing and reacting appropriate quantities of high purity elemental Hg, Cd and Te in pre-determined proportions in a flat-bottomed quartz ampoule that has been sealed off under vacuum and stationed in heat-transmissive contact to a cooling block. The reaction takes place in a pressure vessel housed in a rocking furnace. Once the materials are reacted, rapid solidification is induced by dischargeing a large volume of coolant gas into a specially designed high throughput cooling block with which the flat-bottomed ampoule is in good thermal contact. During this rapid quenching, the entire system is locked in a horizontal position by means of an automatic levelling system.

APPARATUS

Figure 1:
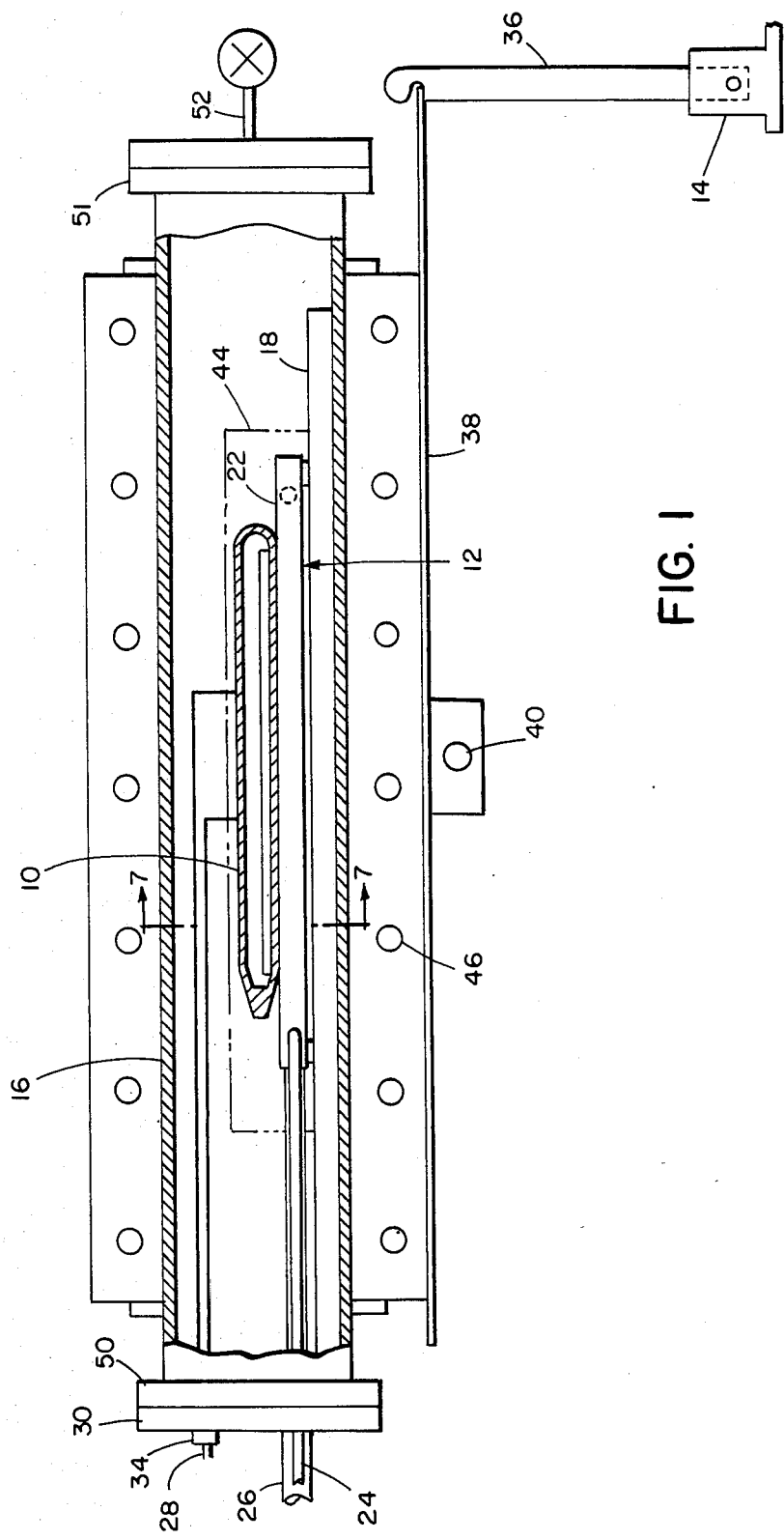
FIG. 1 is a cross section of PSSR rocking furnace and related apparatus.

The specific apparatus used in this method consists of four parts: the ampoule 10, the cooling block assembly 12, the levelling system 14, and the pressure vessel 16 with the associated plumbing. These parts are shown in a composite drawing labeled FIG. 1.

The ampoule is constructed from flat-bottomed, thick-walled, D-shaped (FIG. 2C) quartz tube 13 depicted in FIGS. 2A–2C. The ampoule is closed on one end and has a round quartz tube 11 attached on the other end for ease in loading and evacuation.

The cooling block assembly 12 is shown in FIG. 3. It consists of a solid square mounting bar 18 with welded tabs 20 and a hollow flat-topped quenching tube 22 attached to it. The mounting bar 18 which is placed inside the pressure vessel 16 during growth serves to hold the quenching tube firmly in place during growth. The hollow flat-topped quenching tube is constructed with a braided ¼ inch stainless steel inlet pressure hose 24 and a larger ID (⅜ inch) braided stainless steel exit hose 26 capable of withstanding high pressures and high temperatures to allow for high throughput of coolant gas during quench. The inlet and exit gas lines are attached by means of Swagelock union (not shown) to appropriate gas feed tubes welded to the pressure vessel mating flange 30 (FIG. 4). The cooling block and hoses are detachable from the mounting block after removing the wing nuts from the welded tabs on the mouting bar and disconnecting the Swagelock unions on the braided gas lines. A pressure buttressing line 52 is attached to pressure vessel mating flange 51 to pressurize the vessel.

FIG. 4 shows the thermocouple feed through arrangement in the mating flange 30 which directly monitors the temperature of the cooling block and the ampoule during quench. Also connected via a Swagelock union is a "U" shaped tube containing at least 3 thermocouples 28 set in high temperature epoxy 32 within the "U" bend. The thermocouple ends are fed through a Swagelock connector into the pressure vessel. The "U" tube is then connected to the mating flange by the Swagelock connector 34. This arrangement allows for quick and easy replacement of the entire thermocouple assembly should a thermal sensor fail. It provides the feed through of thermal sensors from the ambient environment to inside the pressure vessel which is maintained at high temperature and pressure during the melt and reaction.

In order to provide planarity of the solidified plank and to insure complete covering of the flat-bottomed face of the ampoule by the melt prior to quenching, a levelling system 14 is employed.

Figure 5:
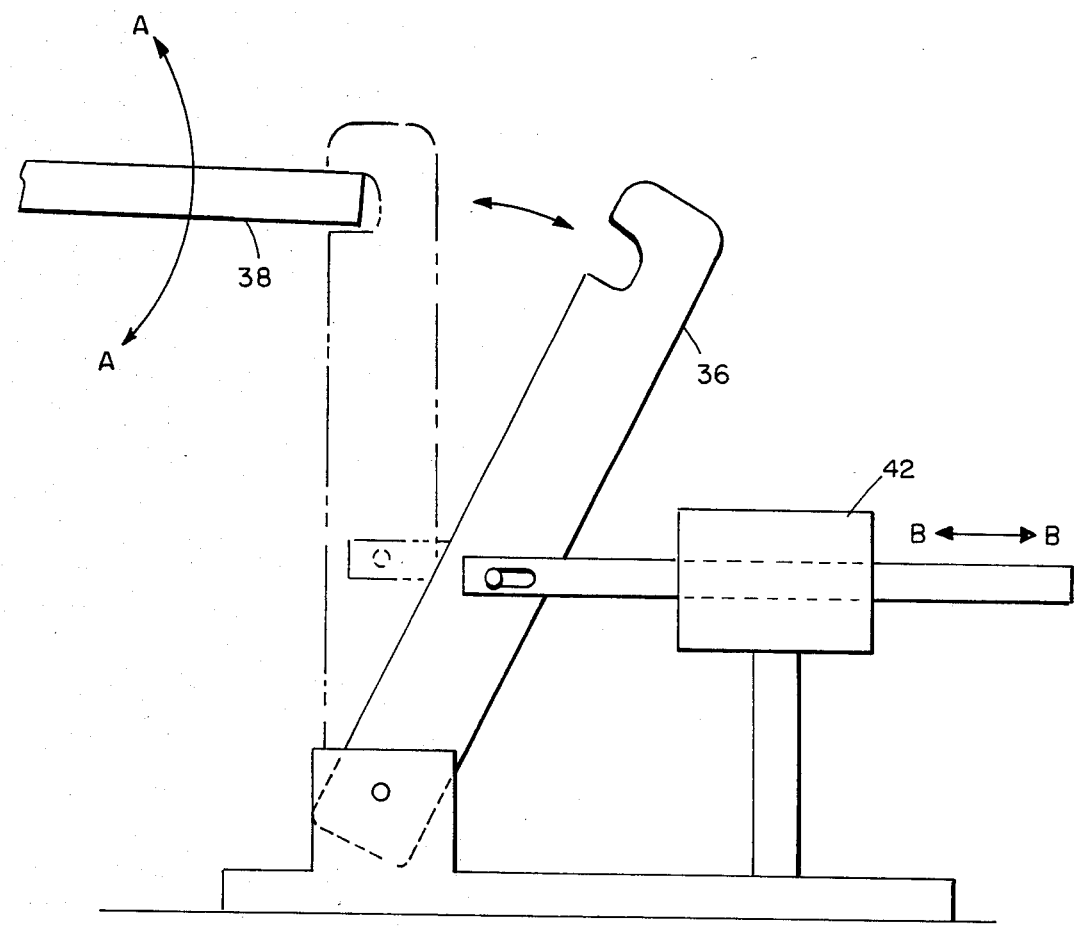
FIG. 5 is a somewhat diagrammatic view of the ampoule levelling system.
Figure 7:
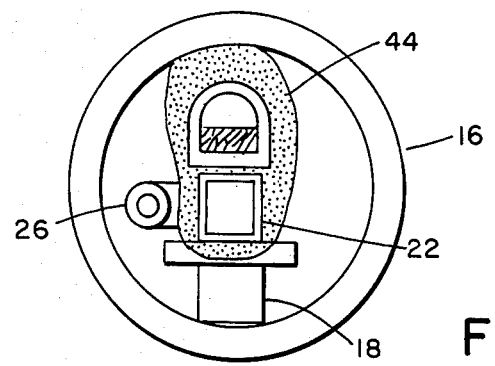
FIG. 7 is a side sectional view of a portion of the rocking furnace and its contents, taken along 7—7 of FIG. 1.

The levelling system (FIG. 5) is a solenoid activated lever arm 36 that contacts on edge of the rocking furnace cradle 38. This cradle supports the furnace and pivots on a split shaft 40 connected to a motor drive which imparts a rocking motion (arrow A) to the system. The levelling system locks the cooling block and ampoule in a horizontal position immediately prior to the quenching stage. This insures that the top surface of the HgCdTe melt is free and parallel to the bottom quenching surface so that the plank is of uniform thickness after solidification. The primary component of the levelling system is slotted lever arm 36 which when activated engages with the end of the rocking furnace cradle to halt the rocking motion and lock the system in a horizontal position. The lever arm is pivoted at its base and driven by a positive throw solenoid 42 activated (arrow B) by an on-off switch.

The furnace includes windings 46 to generate heat to melt the ampoule's contents. Once the molten HgCdTe liquid is adequately mixed, the levelling system is turned on. This activates the solenoid to pivot the levelling system arm and contact the rocking furnace cradle, stopping the rocking (mixing) cycle. It locks the entire apparatus (furnace, pressure vessel, cooling block and ampoule) in a horizontal position for quenching.

The pressure vessel 16 is an integral part of the Planar Quench system. It consists of a thick metal (e.g. Inconel 600) pipe with mating flanges 50 and 51 welded on both ends. It also consists of coolant and buttressing gas plumbing and valving. The pressure vessel serves two purposes: (1) it provides a positive buttressing pressure during the reaction/solidification cycle which relieves some of the stress placed on the ampoule from the high internal Hg vapor pressure; and (2) it provides the high flow delivery gas for the quenching stage. The pressure vessel and gas plumbing is shown diagrammatically in FIG. 6.

Figure 6:
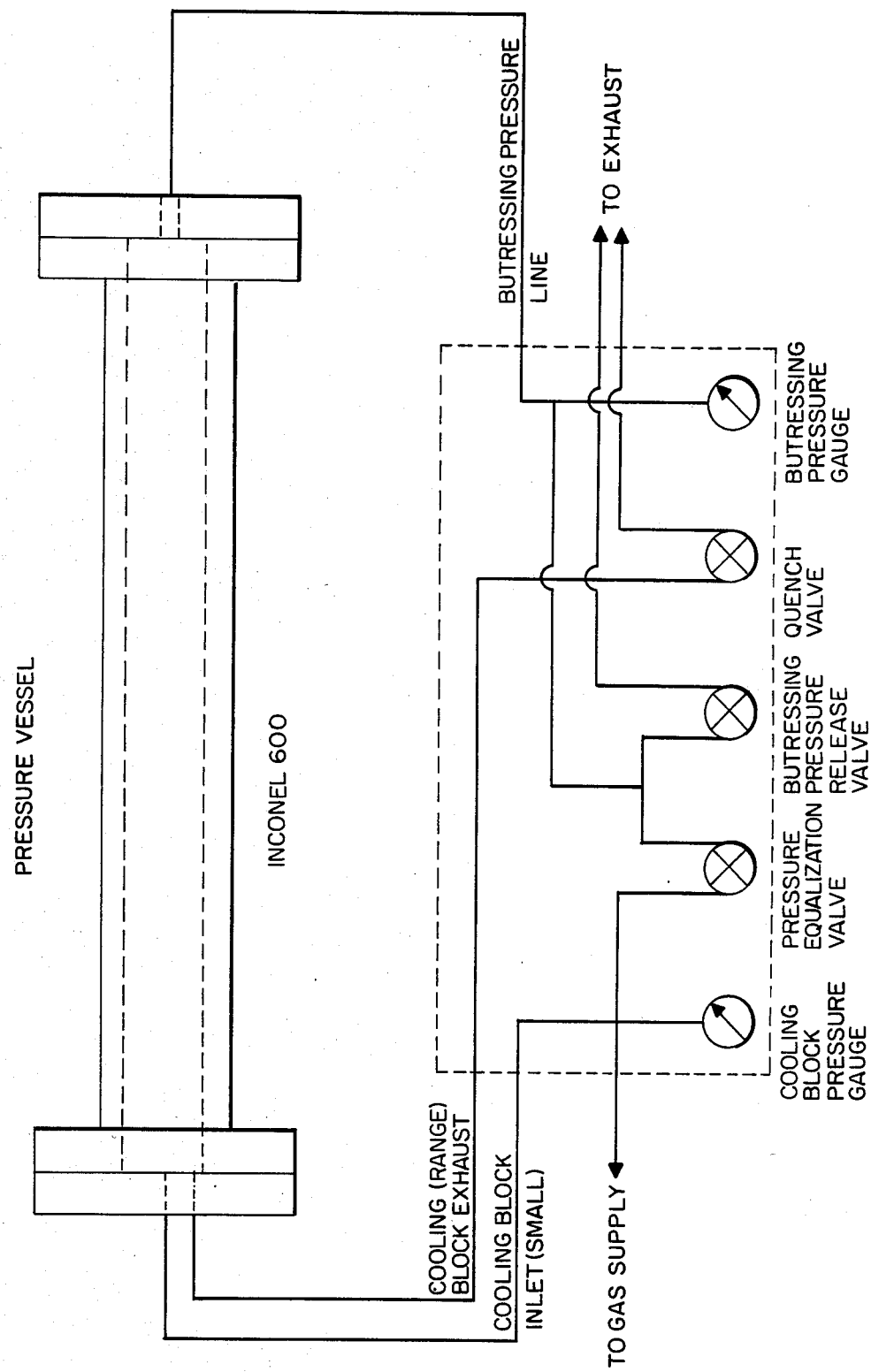
FIG. 6 is a somewhat diagrammatic view of the pressure vessel and cooling block plumbing.

A diagrammatic cross section of a Planar Quench system is shown in FIG. 6. A flat-bottomed quartz ampoule 10 containing a HgCdTe alloy to be solidified is butted against a hollow square cooling block. Thermal insulation 44 is provided for the entire ampoule/cooling block assembly except for the flat interface between the two. Inlet and exit lines (not shown) are attached to the cooling block and the entire apparatus is mounted on a rigid mounting bar and placed in a pressure vesel that in turn is located inside a rocking furnace.

The temperature of the furnace is gradually increased to above the liquidus termperature of the HgCdTe alloy and the pressure in the pressure vessel and cooling block is increased in a stepwise fashion that compensates for the high internal Hg pressure generated inside the ampoule. Once the liquidus temperature is reached the entire system (furnace pressure vessel, ampoule and cooling block) is gently rocked to enhance liquid mixing.

After homogenization of the melt is complete, power to the furnace is turned off. The levelling system is activated and locks the furnace and its contents into a horizontal position for quenching. A pressure equalization valve is closed that separates the buttresing gas pressure from coolant gas pressure.

The quench is initiated by a high velocity jet of coolant gas that is forced through a hollow cooling block and removes heat from the flat-bottom face of the ampoule. The insulation placed around the ampoule and cooling block allows the heat to be transferred in response to a high temperature gradient caused by the high velocity coolant gas flow. As heat is removed from the melt, the HgCdTe alloy solidifies in a dendritic fashion. The dendritic structure reduces the spatial variation in composition to a much smaller distance, thus increasing the ability to overcome such variation. During subsequent solid state recrystallization, the compositional variation is then more easily removed and the dendrite structure is more easily annealed.

The rate of cooling can be adjusted by adjusting the rate of gas flow through the cooling block, and the rate is preferably at least 550° C./min, and most preferably over 650° C./min.

After solidification, the material is subjected to a solid state recrystallization according to traditional techniques. For example, the material may be heated to about 600°–650° C. without heating it above the liquidus point. (The liquidus point varies according to composition.) The material is maintained at that temperature e.g. for 8–10 days. Examples of solid state recrystallization times and temperatures are provided in Kruse et al., U.S. Pat. No. 3,723,190 which is herely incorporated by reference.

Figure 8:
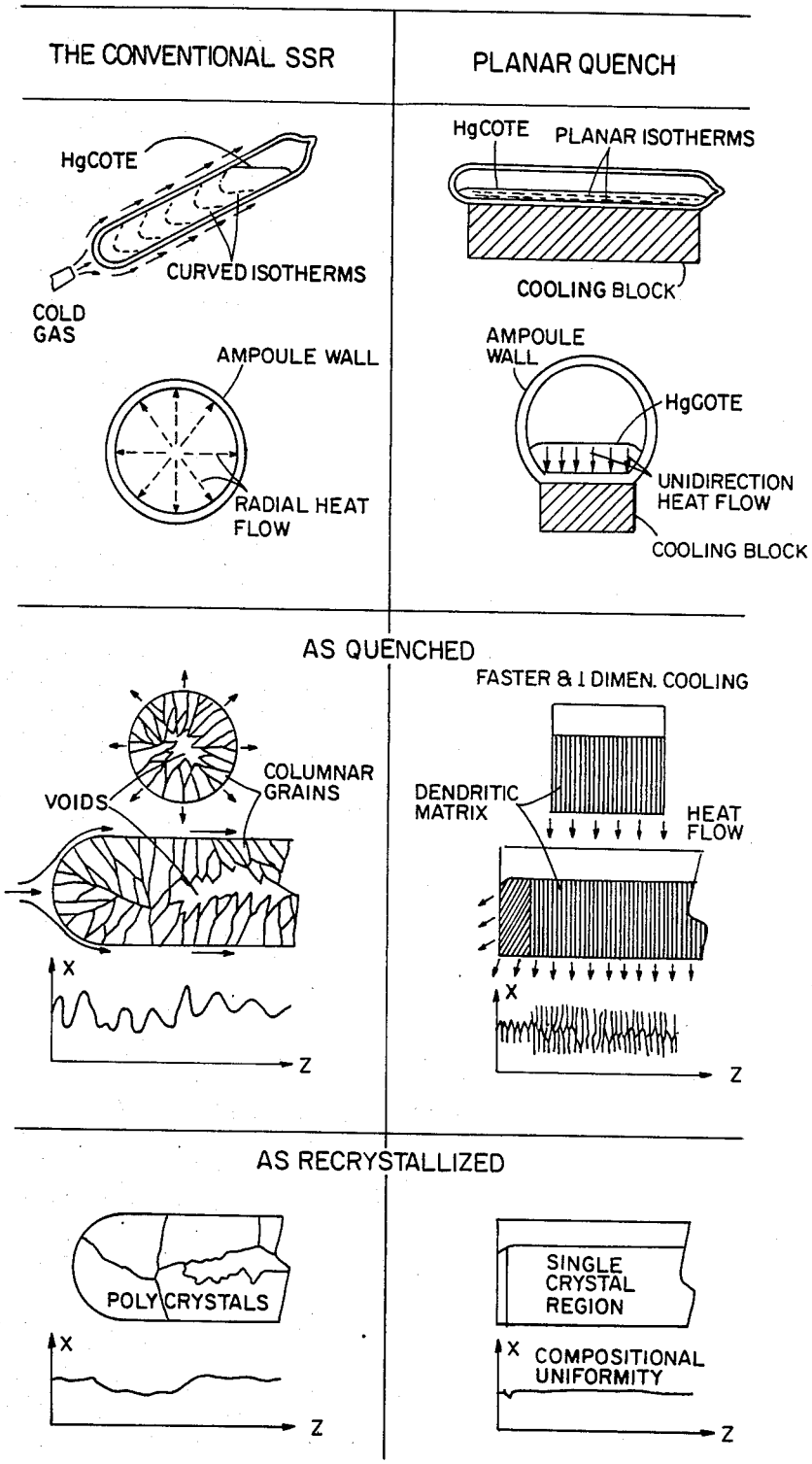
FIG. 8 shows, diagrammatically, the effects of conventional of SSR quenching techniques as compared to PSSR techniques.

FIG. 8 demonstrates the advantages of unidirectional cooling, compared to radial cooling experienced with conventional SSR in that unidirectional cooling provides greater compositional uniformity, larger crystals and a regular dendritic matrix. Specifically the variation in the ratio of Hg to Cd is less than plus or minus 0.0007 over one inch, and dendritic spacing is less than 50 microns.

Other embodiments are within the following claims.

We claim:

1. In a method of growing crystals of mercury cadmium telluride (MCT) in which MCT is melted within a sealed elongated ampoule having a wall, and thereafter solidified and subjected to a solid state recrystallization, the improvement comprising;
    solidifying said MCT while
    maintaining said ampoule in a substantially horizontal position
    maintaining heat-transfer contact between at least a portion of the liquid-containing segments of the ampoule wall and a non-volatile heat sink external to said ampolue and
    removing heat from portions of said ampoule in contact with said heat sink.

2. The method of claim 1 wherein said molten MCT within said ampoule has a generally flat upper surface when said ampoule is in said substantially horizontal position, and said heat is removed from said ampoule in a direction generaly perpendicular to said surface of said molten MCT.

3. The method of claim 1 wherein said MCT is solidified at a rate in excess of 550° C./minute.

4. The method of claim 1 wherein said ampoule has a bottom comprising a flat surface extending longitudinally and contacting said heat sink.

5. The method of claim 1 wherein said solidification takes place within a furnace, and including the steps of insulating said heat sink and ampoule from ambient conditions in said furnace during solidification.

6. The method of claim 5 wherein said insulating step comprises the step of surrounding the non-contacting portions of said ampoule and heat sink with a layer of thermally insulating material.

7. The method of claim 5 wherein, prior to said solidification, said ampoule is rocked while said MCT is molten, and said ampoule is locked in said substantially horizontal position within said furnace.

8. The method of claim 5 wherein said furnace comprises a first means for providing a pressurized gas flow, and including the steps of placing said ampoule within a pipe and supplying pressurized gas to said pipe from said first gas flow means.

9. The method of claim 8 including the step of maintaining external buttressing pressure on said ampoule during at least part of said solidification step.

10. The method of claim 8 wherein said heat sink comprises a cooling block having an internal gas flow path between a gas inlet and a gas outlet, and said furnace comprises a second means for providing a pressurized gas flow, said second gas flow means being separate from said first gas flow means and connected to said cooling block inlet, and wherein said buttressing step is performed independently of said solidification step.

11. The method of claim 1 wherein said ampoule is generally "D"-shaped in transverse cross-section and has a flat surface, and including the step of mounting said ampoule such that the flat surface contacts said heat sink and faces downwardly when said ampoule is in said substantially horizontal position.

12. The method of claim 1 wherein said heat sink comprises an elongated cooling block and said method further comprises the step of passing fluid through said block to remove heat therefrom.

13. The method of claim 12 wherein said flowing fluid is a gas, said cooling block includes an internal flow path between a gas inlet and a gas outlet, and said method further comprises the step of supply pressurized gas to said gas inlet.

14. The method of claim 13 including the step of placing said ampoule in a pipe prior to said solidification and maintaining gas under pressure in said pipe during at least a portion of said solidification step, to buttress internal ampoule pressure.

* * * * *